United States Patent
Shamala et al.

(10) Patent No.: US 12,388,421 B2
(45) Date of Patent: Aug. 12, 2025

(54) TRANSFORMER FILTER WITH NOTCH

(71) Applicant: NXP B.V., Eindhoven (NL)

(72) Inventors: Rajesh Prabhakar Shamala, Warangal (IN); Stephane Damien Thuriés, Saubens (FR); Achal Venkatesh, Bangalore (IN); Erik Olieman, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/484,708

(22) Filed: Oct. 11, 2023

(65) Prior Publication Data

US 2025/0119118 A1    Apr. 10, 2025

(30) Foreign Application Priority Data

Oct. 6, 2023   (IN) .............................. 202341067079

(51) Int. Cl.
*H03H 11/04*    (2006.01)

(52) U.S. Cl.
CPC ..... *H03H 11/04* (2013.01); *H03H 2011/0488* (2013.01)

(58) Field of Classification Search
CPC .. H03H 11/04; H03H 2011/0488; H03H 7/09; H03H 7/0115; H01F 27/2804; H04B 1/525; H04B 1/1027; H04B 2001/1045; H04B 1/0057; H04B 1/0067; H04B 1/50; H04B 1/1036; H04B 15/02; H04B 1/10; H04B 1/0475; H04B 1/109; H04B 1/719; H04B 2001/0491; H04B 2001/1072; H04B 1/18; H04B 3/32; H04B 1/04
See application file for complete search history.

(56) References Cited

U.S. PATENT DOCUMENTS

| | | | |
|---|---|---|---|
| 7,262,674 B2 | 8/2007 | Kamgaing | |
| 8,072,290 B2 * | 12/2011 | Rofougaran | ............. H03H 7/20 333/25 |
| 9,166,731 B2 | 10/2015 | Chang et al. | |
| 2006/0284705 A1 | 12/2006 | Kamgaing | |
| 2008/0180579 A1 | 7/2008 | Maxim | |

(Continued)

FOREIGN PATENT DOCUMENTS

WO    WOD-2022015541 A1    1/2022

OTHER PUBLICATIONS

Arya, R. et al., "Gm-C Biquad Filter for Low Signal Sensor Applications", MIXDES 2016, 23rd International Conference Mized Design of Integrated Circuits and Systems; Jun. 23-25, 2016; pp. 207-210.

(Continued)

*Primary Examiner* — John W Poos

(57) ABSTRACT

A device includes a filter circuit having both a transformer and a notch filter. The notch filter is formed via capacitive cross-coupling of windings of the transformer. The transformer includes a first winding with an input terminal and an output terminal and a second winding with an input terminal and an output terminal. The notch filter is formed by coupling a first capacitor between the input terminal of the first winding and the output terminal of the second winding, and by coupling a second capacitor between the output terminal of the first winding and the input terminal of the second winding.

17 Claims, 4 Drawing Sheets

(56) References Cited

U.S. PATENT DOCUMENTS

| | | | | |
|---|---|---|---|---|
| 2012/0146741 A1* | 6/2012 | Yen | ................... | H01L 23/5227 |
| | | | | 29/25.01 |
| 2013/0328642 A1 | 12/2013 | Ma et al. | | |
| 2018/0026602 A1* | 1/2018 | Freeman | ................. | H03H 7/06 |
| | | | | 333/176 |
| 2020/0366310 A1* | 11/2020 | Gruber | ..................... | H01P 5/10 |
| 2022/0021365 A1* | 1/2022 | Vigilante | ............. | H03H 7/1708 |
| 2022/0216856 A1* | 7/2022 | Myoung | ................ | H03F 1/565 |

OTHER PUBLICATIONS

Chien, C., "Miniaturized Full Differential Bandpass Filter Design Embedded in Organic Substrate", IEEE Proceedings of the Asia-Pacific Microwave Conference 2011; Dec. 5-8, 2011; pp. 1933-1936.

Huang, C. et al., "Design of Compact Bandpass Filter Using Transformer-Based Coupled Resonators on Integrated Passive Device Glass Substrate", IEEE Proceedings of the Asia-Pacific Microwave Conference 2011; Dec. 5-8, 2011; pp. 1921-1924.

* cited by examiner

TRANSFORMER FILTER WITH NOTCH

CROSS-REFERENCE TO RELATED APPLICATIONS

This application claims priority under 35 U.S.C. § 119 to Indian Patent Application number 202341067079, filed Oct. 6, 2023, the contents of which are incorporated by reference herein.

BACKGROUND

Many electronic devices employ a digital-to-analog converter (DAC) to generate analog signals for various applications. For example, some radar systems synthesize a radar signal in the digital domain and employ a DAC to convert the digital signal to an analog signal for transmission. However, in at least some cases the DAC introduces unwanted components (e.g., images and harmonics) into the analog signal. Some devices employ a filter, such as a tank filter, to reduce the impact of the unwanted components on the analog signal. However, conventional filters have a relatively limited impact on the unwanted components and are thus not well-suited for some devices and applications, such as radar applications wherein the analog output signal of the DAC is fed to a multiplier.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
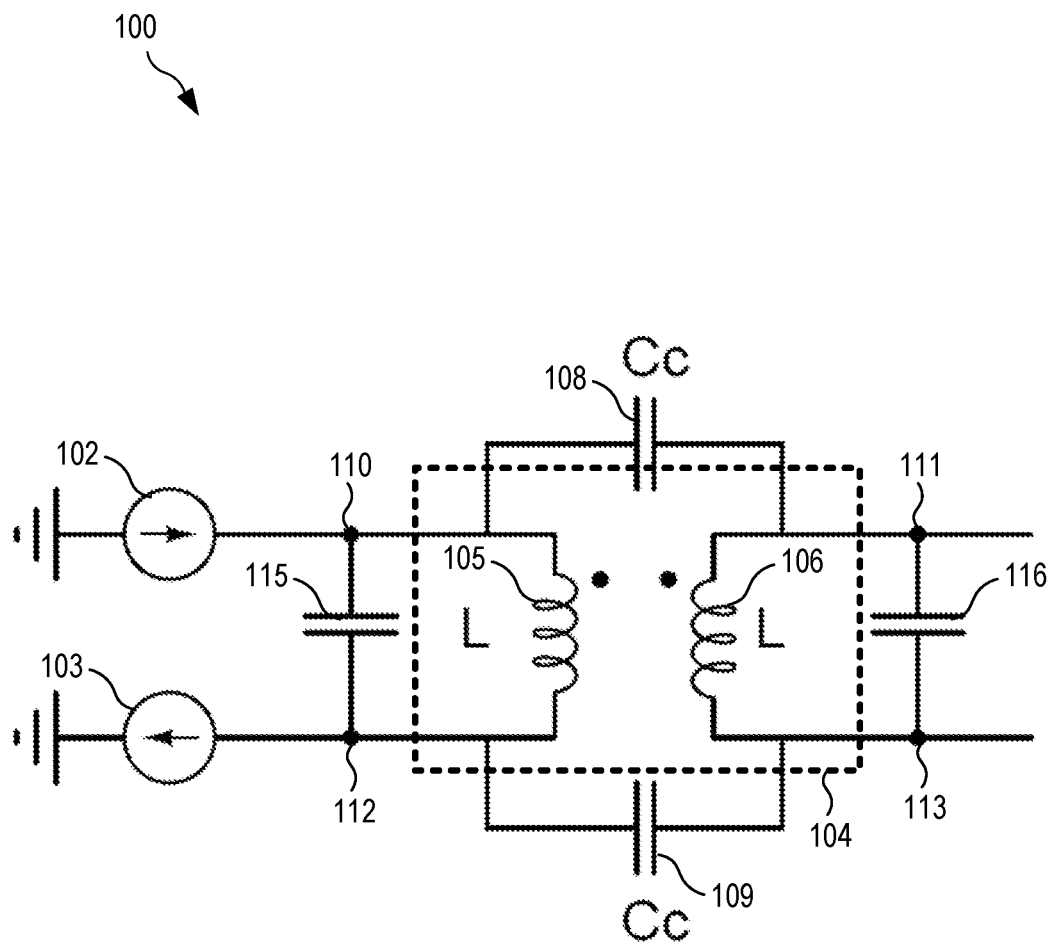
FIG. 1 is a block diagram of a filter circuit that employs a transformer and a notch filter in accordance with some embodiments.

FIGS. 1-4 illustrate circuits and devices including a filter circuit having both a transformer and a notch filter in accordance with some embodiments. The notch filter is formed via capacitive cross-coupling of windings of the transformer. For example, in some embodiments the transformer includes a first winding with an input terminal and an output terminal and a second winding with an input terminal and an output terminal. The notch filter is formed by connecting a first capacitor between the input terminal of the first winding and the output terminal of the second winding, and by connecting a second capacitor between the output terminal of the first winding and the input terminal of the second winding. This configuration results in the frequency response of the overall filter circuit having a notch at a particular frequency, wherein the notch frequency is based on the capacitive value of the capacitors used in the cross-coupling. This notch, together with the filter characteristics of the transformer itself, allow the overall filter circuit to provide increased rejection of unwanted signal components in an input signal, without adding much noise or non-linearity to the output signal. The filter circuit is thus well-suited for applications that require relatively high rejection of images and harmonics.

To illustrate via an example, some radar devices, such as Frequency-Modulated Continuous Wave (FMCW) radar systems, synthesize a radar signal in the digital domain, then employ a DAC to convert the digital radar signal to an analog signal, multiply the analog signal to increase the signal amplitude for transmission, and then transmit the multiplied signal. However, the DAC can introduce unwanted images and harmonics into the analog signal, and the multiplication of the signal can exacerbate the impact of the unwanted images and harmonics, and thus degrade the overall performance of the radar device. Conventionally, a filter is employed to reject the unwanted images and harmonics from the analog output signal of the DAC. However, conventional filters typically do not provide sufficiently high signal rejection (e.g., providing 38 dB rejection or less). Furthermore, these conventional filters can add noise and distortion to the analog signal.

In contrast to these conventional filters, described herein are embodiments of a filter circuit that employs two components: a transformer and a notch filter. The transformer provides magnetic coupling of an input signal and an output signal that gives two resonating peaks, wherein the separation between the peaks depends on the level of the magnetic coupling. The effect of these resonating peaks is to provide a first order slope in the frequency response of the transformer at lower frequencies and a third order slope in the frequency response of the transformer at higher frequencies. This results in a relatively high signal rejection (e.g., 44 dB).

The notch filter is formed by capacitive cross-coupling the windings of the transformer. This creates high levels of signal rejection, sometimes referred to as "zeroes", at and around a notch frequency. The notch frequency is based at least in part on the level of capacitance (that is, the size of the capacitors) employed in the capacitive cross-coupling. Thus, by selecting and employing capacitors of a particular value, the notch frequency of the notch filter is set to a corresponding level. Accordingly, in some embodiments the capacitors are set to a value such that the filter circuit has increased rejection at and around the frequency of the unwanted images and harmonics, thus improving the overall performance of the filter circuit and the corresponding radar system.

FIG. 1 illustrates a filter 100 in accordance with some embodiments. In the illustrated example, the filter 100 includes a current source 102, a current sink 103, a transformer 104 including a first (primary) winding 105 and a second (secondary) winding 106, and further includes capacitors 108, 109, 115, and 116. The current source 102 includes a first terminal connected to a ground voltage reference. The current sink 103 includes a first terminal connected to the ground voltage reference and a second terminal connected to a node 112. The capacitor 115 includes a first terminal connected to the node 110 and a second terminal connected to the node 112.

The first winding 105 includes an input terminal connected to the node 110 and an output terminal connected to the node 112. The second winding 106 includes an input terminal connected to a node 113, and an input terminal connected to a node 111. The capacitor 116 includes a first terminal connected to the node 111 and a second terminal connected to the node 113. The capacitor 108 includes a first terminal connected to the node 110 and a second terminal connected to the node 111. The capacitor 109 includes a first terminal connected to the node 112 and a second terminal connected to the node 113.

In operation, the current source 102 applies a current at node 110, thus charging the capacitor 115 to a voltage based on the amplitude of the current. The capacitor discharges to the ground reference via the current sink 103. In at least some embodiments, the amplitude of the current supplied by the current source 102 changes over time, such that the supplied current, and therefore the charge at the capacitor 115, and the voltage across the nodes 110 and 112, represent an input signal for the filter 100.

The transformer 104 transforms the input voltage across the nodes 110 and 112 to an output voltage across the nodes 111 and 113, and therefore across the capacitor 116. The relationship between the output voltage and input voltage is governed by the ratio in the number of coil turns between the winding 105 and the winding 106. That is, the ratio of the input voltage to the output voltage is equal to the ratio of the number of turns in the winding 105 to the number of turns in the winding 106. In addition, when an alternating current signal is applied at the input to the transformer 104, the windings 105 and 106 act as two resonators that couple magnetically, thus providing voltage transformation that varies according to the frequency of the input signal. In particular, the magnetic coupling applies two resonating peaks such that the frequency response of the transformer 104 has a first order slope at lower frequencies and a third order slope at higher frequencies. This third order slope allows the transformer 104 to be used as a filter that rejects higher frequencies, wherein the rejected frequencies are based on coupling factor, designated K, between the windings 105 and 106.

The capacitors 108 and 109 are connected such that the windings 105 and 106 are capacitively cross-coupled. That is, the capacitor 108 cross-couples the input of the winding 105 to the output of the winding 106. Further, the capacitor 109 cross-couples the input of the winding 106 to the output of the winding 105. This capacitive cross coupling changes the overall frequency response of the filter 100, and in particular places zeroes in the frequency response, thus creating a notch in the frequency response at a notch frequency. The zeroes in the frequency response are set according to the following formula:

$$\frac{1}{2\pi}\sqrt{\frac{2K_m}{L(1-K_m^2)C_c}}$$

where L is the inductance of the windings 105 and 106, Km is the magnetic coupling coefficient for the transformer 104, and Cc is the capacitive values for the capacitors 108 and 109. In some embodiments, the capacitors 108 and 108 have substantially equal (e.g., within one percent) capacitive values.

Thus, as shown by the formula above, the placement of the zeroes, and the corresponding notch, can be set by selecting the capacitors 108 and 109 of a particular corresponding value. This allows the filter 100 to have increased signal rejection around a desired frequency (as set by the capacitors 108 and 109), thus improving the performance of the filter 100. In addition, the filter 100 uses only passive devices (e.g., the transformer 104 and the capacitors 108 and 109), and therefore adds relatively little noise and non-linearity to the input signal.

Figure 2:
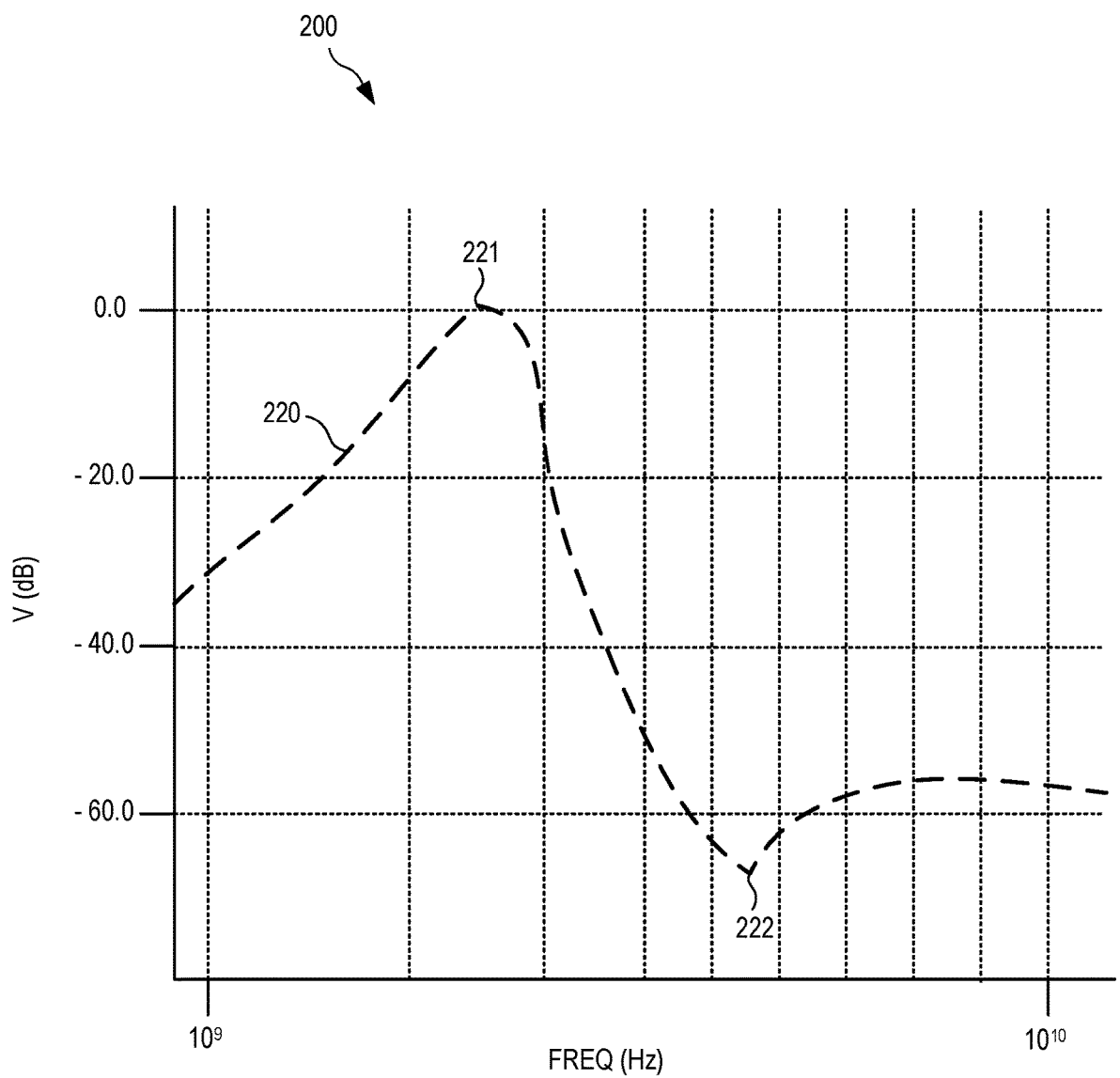
FIG. 2 is a diagram illustrating an example behavior of the filter circuit of FIG. 1 in accordance with some embodiments.

FIG. 2 illustrates a diagram 200 depicting an example frequency response for the filter 100 in accordance with some embodiments. The diagram 200 includes an x-axis representing frequency (in Hertz) and a y-axis representing voltage attenuation (also referred to as rejection) expressed in negative decibels, or dB. The diagram 200 also includes a curve 220, representing the frequency response for the filter 100. In particular the curve 220 indicates, for each frequency, the corresponding amount of rejection for a signal, or signal component, at that frequency.

In the illustrated example, the curve 220 has a peak 221 at or about 2.5 GHZ. This is referred to as the center frequency for the filter 100. As shown, the curve 220 has a substantially first order slope prior to the center frequency and a substantially third order slope at frequencies higher than the center frequency. These different slopes, and thus the different levels of frequency rejection for lower and higher frequencies, are a result of the magnetic coupling between the windings 105 and 106 creating two resonating peaks. The separation between the peaks depends on the level of magnetic coupling between the windings 105 and 106. Further, the third order slope of the curve 220 for higher frequencies indicates a relatively high level of rejection for these higher frequencies compared to at least some conventional tank filters.

In addition, the curve 220 has a notch 222, representing a relatively high level of rejection at a corresponding notch frequency. This notch is created by the capacitive cross-coupling between the windings 105 and 106 of the transformer 104. The notch frequency is based on the capacitive values of the capacitors 108 and 109, as shown above. Thus, by selecting the appropriate capacitor values, the notch frequency for the filter 100 can be selected. This allows the filter 100 to be configured to have increased rejection around a particular frequency of interest. For example, in some embodiments, the notch frequency is set (by selecting the corresponding capacitive values for the capacitors 108 and 109) such that the notch frequency is at the frequency of an unwanted image or harmonic of an analog input signal provided to the filter 100.

Figure 3:
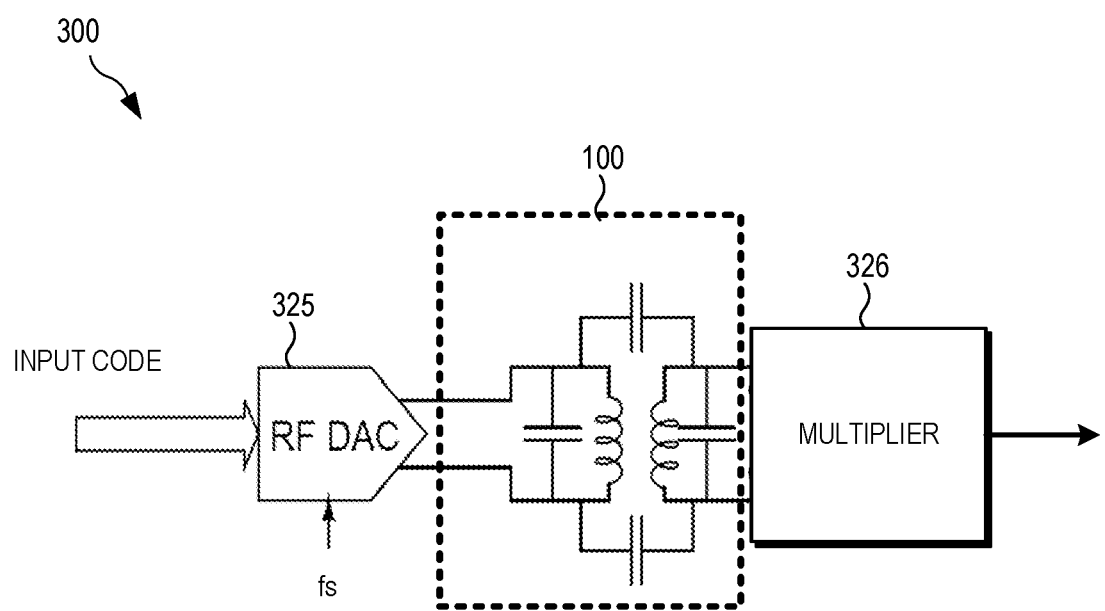
FIG. 3 is a block diagram of a device including a DAC and the filter circuit of FIG. 1 in accordance with some embodiments.

FIG. 3 illustrates a diagram of aspects of a device 300 that incorporates the filter 100 in accordance with some embodiments. In the illustrated example, the device 300 includes the filter 100, a radiofrequency (RF) DAC 325, and a multiplier 326. The RF DAC 325 is configured to receive a digital input code and generate an output signal (e.g., a sinusoidal output signal) having a frequency based on the digital input code, and with a sampling clock of frequency $f_s$. The DAC 325 can be any type of DAC configured to generate an analog output signal having a frequency based on a digital input code (e.g., a delta-sigma DAC, resistor-based DAC, switch-based DAC, and the like).

The filter 100 is connected to the RF DAC 325 to receive the analog output signal, to filter the received analog signal via the transformer 104 and the capacitive cross-coupling of the capacitors 108 and 109, as explained above. The filter 100 thus generates a filter output signal, representing a filtered representation of the analog signal generated by the DAC 325. The multiplier 326 is circuitry configured to receive the filter output signal and multiply the amplitude of that signal by a specified amount, thus generating a multiplied output signal. The multiplied output signal is provided to other circuitry of the device 300 (not shown) for further processing, such as one or more of mixing, amplification, filtering, and transmission.

By employing the filter 100 between the RF DAC 325 and the multiplier 326, the device 300 is able to generate a multiplier output signal that is relatively free of unwanted images and harmonics, collectively referred to as a "frequency spur", that is generated by the RF DAC 325. To illustrate via an example, in some embodiments the device 300 is part of an FMCW radar system, and in particular is part of a signal generator configured to generate a chirp signal for a radar front end of the FMCW radar system. The analog output signal generated by the RF DAC 325 includes a frequency spur that includes unwanted images (that is, unwanted signal components) at or around frequencies that are multiples of the frequency indicated by the input digital code. Without the filter 100, the frequency spur of the DAC output signal would be multiplied by the multiplier 326 at their generated amplitudes. This would result in the chirp signal of the FMCW radar system having high levels of unwanted images and harmonics, resulting in poor system performance. By including the filter 100, the device 300 is able to substantially reject the frequency spur. In particular, the values of the capacitors 108 and 109 are selected such that the corresponding notch frequency of the filter 100 is at or around the frequency of at least one of the unwanted images, resulting in high rejection of the unwanted image. This results in a chirp signal that is relatively free of the unwanted images and harmonics, improving overall system performance.

Figure 4:
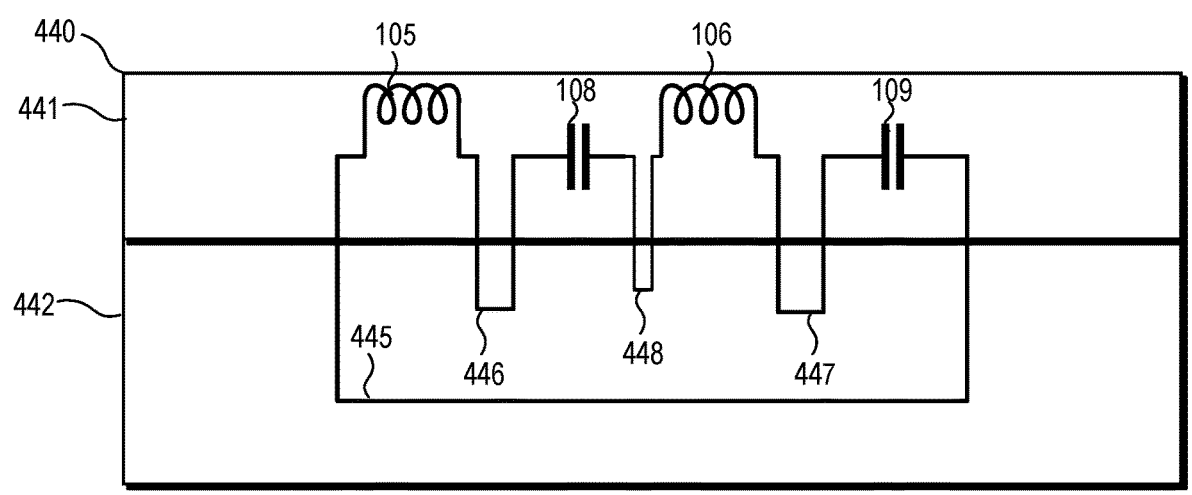
FIG. 4 is a diagram illustrating routing of portions of the notch filter of FIG. 1 in accordance with some embodiments.

In some cases, the routing of the connections for the cross-coupled capacitors 108 and 109 results in parasitic resistance and parasitic inductance at the filter 100. This parasitic resistance and inductance can degrade both the notch (that is, reduces the amount of voltage rejection associated with the notch) and the amount of rejection at higher frequencies, thus degrading the overall performance of the filter 100. Accordingly, in some embodiments the connections of the capacitors 108 and 109 are routed to reduce the amount of parasitic inductance and resistance and thus improve overall filter performance. An example is illustrated at FIG. 4 in accordance with some embodiments.

In the illustrated example, the filter 100 is part of an integrated circuit device 440. The integrated circuit device 440 is or includes a semiconductor device having at least two semiconductor layers, designated layers 441 and 442, wherein layer 442 is formed such that it is located underneath layer 441. Furthermore, in the depicted example, the capacitors 108 and 109 are connected to the windings 105 and 106 of the transformer 104 via a set of interconnects. In particular, the capacitor 108 has a first terminal connected to the input of the winding 105 via an interconnect 446 and a second terminal connected to the output of the winding 106 via an interconnect 448. The capacitor 109 has a first terminal connected to the input of the winding 106 via an interconnect 447 and a second terminal connected to the output of the winding 105 via an interconnect 445.

The windings 105 and 106, as well as the capacitors 108 and 109, are formed such that these components are located at the semiconductor layer 441 of the integrated circuit 440. However, the interconnects 445, 446, 447, and 448 are formed such that a portion of each interconnect is located at the semiconductor layer 442. Thus, the cross-coupled connections of the capacitors 108 and 108 to the windings 105 and 106 are routed underneath the components of the filter 100. In at least some cases, this routing shortens the overall length of at least one of the interconnects 445, 446, 447, and 448. This reduced length reduces the parasitic resistance and inductance associated with the filter 100, and thus improves the overall filter performance.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device comprising:
   a digital-to-analog converter (DAC) having at least one output;
   a transformer including a first winding and a second winding, wherein the at least one output of the DAC is directly connected to the first winding of the transformer; and
   a notch filter including a first capacitive cross-coupling of the first winding and the second winding, wherein the DAC is configured to provide an output signal to the transformer, the output signal having a frequency spur, and the notch filter is configured to substantially reject the frequency spur.

2. The device of claim 1, wherein:
   the notch filter comprises a second capacitive cross-coupling of the first winding and the second winding.

3. The device of claim 2, wherein:
   the first capacitive cross-coupling includes a first capacitor having a first terminal connected to an input terminal of the first winding and a second terminal connected to an output terminal of the second winding.

4. The device of claim 3, wherein:
   the second capacitive cross-coupling includes a second capacitor having a first terminal connected to an output terminal of the first winding and a second terminal connected to an input terminal of the second winding.

5. The device of claim 4, wherein:
   the first capacitor and the second capacitor have substantially equal capacitances.

6. The device of claim 1, wherein:
   the device includes a semiconductor having a first layer and a second layer;
   the first winding and the second winding are located at the first layer of the semiconductor; and
   at least a portion of the first capacitive cross-coupling is located at the second layer of the semiconductor.

7. The device of claim 6, wherein the second layer is located under the first layer.

8. The device of claim 1, further comprising:
   a multiplier coupled to an output of the transformer.

9. A semiconductor device comprising:
   a digital-to-analog converter (DAC) including an output to provide an output signal;
   a transformer connected directly to the output of the DAC;
   a notch filter coupled to the transformer, the notch filter including:
      a first capacitive cross-coupling of a first winding the transformer and a second winding of the transformer; and
      a first layer and a second layer, wherein the first winding and the second winding are located at the first layer, and at least a portion of the first capacitive cross-coupling is routed via the second layer.

10. The semiconductor device of claim 9, wherein:
    the notch filter comprises a second capacitive cross-coupling of the first winding and the second winding.

11. The semiconductor device of claim 10, wherein:
    the first capacitive cross-coupling includes a first capacitor having a first terminal connected to an input terminal of the first winding and a second terminal connected to an output terminal of the second winding.

12. The semiconductor device of claim 11, wherein:
    the second capacitive cross-coupling includes a second capacitor having a first terminal connected to an output terminal of the first winding and a second terminal connected to an input terminal of the second winding.

13. The semiconductor device of claim 12, wherein:
    the first capacitor and the second capacitor have substantially equal capacitances.

14. The device of claim 9, wherein the second layer is located under the first layer.

15. A method, comprising:
    providing, by a digital-to-analog converter (DAC) that is directly connected to a transformer, an input signal directly to the transformer;
    filtering the input signal at the transformer, the transformer including a first winding and a second winding;
    notch filtering the input signal at a first capacitive cross-coupling of the first winding and the second winding, wherein the notch filtering produces a filtered signal at an output of the transformer, the method further comprising;
    receiving, by a multiplier connected directly to an output of the transformer, the filtered signal; and
    multiplying, by the multiplier, an amplitude of the filtered signal.

16. The method of claim 15, wherein the notch filtering comprises:
    notch filtering the input signal at a second capacitive cross-coupling of the first winding and the second winding.

17. The method of claim 16, wherein
    the first capacitive cross-coupling includes a first capacitor having a first terminal connected to an input terminal of the first winding and a second terminal connected to an output terminal of the second winding; and
    the second capacitive cross-coupling includes a second capacitor having a first terminal connected to an output terminal of the first winding and a second terminal connected to an input terminal of the second winding.

* * * * *